United States Patent [19]
Moutou

[11] 4,045,252
[45] Aug. 30, 1977

[54] METHOD OF MANUFACTURING A SEMICONDUCTOR STRUCTURE FOR MICROWAVE OPERATION, INCLUDING A VERY THIN INSULATING OR WEAKLY DOPED LAYER

[75] Inventor: Paul Cyril Moutou, Paris, France

[73] Assignee: Thomson-CSF, Paris, France

[21] Appl. No.: 622,455

[22] Filed: Oct. 15, 1975

[30] Foreign Application Priority Data

Oct. 18, 1974 France ............................... 74.35143

[51] Int. Cl.[2] ............................................ H01L 7/54
[52] U.S. Cl. .................................................. 148/1.5
[58] Field of Search .......................... 148/1.5, DIG. 1

[56] References Cited

U.S. PATENT DOCUMENTS

| | | | |
|---|---|---|---|
| 3,352,725 | 11/1967 | Antell | 148/186 |
| 3,649,369 | 3/1972 | Hunsperger et al. | 148/1.5 |
| 3,747,203 | 7/1973 | Shannon | 148/1.5 X |
| 3,856,578 | 12/1974 | Payne et al. | 148/1.5 |
| 3,904,449 | 9/1975 | DiLorenzo et al. | 148/175 |

OTHER PUBLICATIONS

Poltoratskii et al., "Coherent Radiation of GaAs—by The Diffusion of Beryllium," Soviet Physics–Solid State, vol. 7, No. 7, Jan. 1966, pp. 1798, 1799.

*Primary Examiner*—L. Dewayne Rutledge
*Assistant Examiner*—John M. Davis
*Attorney, Agent, or Firm*—Oblon, Fisher, Spivak, McClelland & Maier

[57] ABSTRACT

The method relates to the production of a very thin insulating or weakly-doped layer in the immediate neighborhood of a highly-doped layer within the body of a semiconductor structure designed to operate in the microwave range. For instance a $P^+$ I $N^+$ structure is obtained in an $N^+$ -doped gallium arsenide substrate, by implanting a $P^+$ -layer using beryllium ions. An insulating layer is spontaneously formed between the highly-doped layers. Using beryllium, the thickness is effectively of the order of one-tenth of a micron. In another example, an avalanche diode of high efficiency, made of gallium arsenide for microwave operation, having a $P^+$ $N^-$ $N^+$ N $N^+$ structure is obtained wherein the layer $N^-$ is the thin weakly-doped layer in the immediate neighborhood of a highly-doped layer ($N^+$), which is subtantially as thin as the $N^-$ layer in this particular case.

3 Claims, 4 Drawing Figures

METHOD OF MANUFACTURING A SEMICONDUCTOR STRUCTURE FOR MICROWAVE OPERATION, INCLUDING A VERY THIN INSULATING OR WEAKLY DOPED LAYER

BACKGROUND OF THE INVENTION

The present invention relates to the production of at least one thin insulating or weakly-doped layer located in the neighbourhood of a highly-doped layer in the body of a semiconductor material. The component possessing this structure also forms an object of the invention. The invention is concerned in particular with PIN structures in which a layer with a very low doping ratio, also known as an intrinsic or insulating layer, is arranged between two layers of opposite conductivity type, which are more or less highly doped. In the case of structures designed to operate in the microwave range, the insulating layer may be limited to a thickness in the order of a tenth of a micron. Also, in microwave work, more complex structures are encountered in which there are a succession of layers having different kinds of doping, certain ones of which are extremely thin.

It is possible using known methods, in particular epitaxy, to produce very thin very highly-doped layers, rarely however of a thickness less than one micron. It is possible by ion implantation to produce layers of this kind. On the other hand, however, no easy method is known of producing a very thin very weakly-doped layer in very close proximity of a normally doped layer. In addition, when producing an intrinsic layer in gallium arsenide, recourse has to be had to doping by compensation using copper ions which have a tendency to diffuse, this causing a deterioration in the structure during manufacture when it is subjected to later processes at relatively high temperature.

BRIEF SUMMARY OF THE INVENTION

The invention overcomes these difficulties.

According to the invention, there is provided a method of manufacturing a semiconductor structure designed for microwave operation, comprising at least two following steps:

a. doping by N impurities at least a layer of a gallium arsenide substrate having two parallel large faces;

b. bombarding said layer with beryllium ions so as to implant a P-doped layer parallel to said large faces, thus promoting at the border separating the N and P layers the formation of a thin layer much less doped than said N and P layers.

BRIEF DESCRIPTION OF THE DRAWINGS

The invention will be better understood and other of its features rendered apparent, from a consideration of the ensuing description and FIGS. 1 and 2 which illustrate in respect of two embodiments comprising different semiconductor layers:

at (a) a partial section through each structure;

at (b) a "doping profile" (graph on rectangular coordinates, showing the doping ratio as a function of the distance along an axis perpendicular to said layers).

DESCRIPTION OF THE PREFERRED EMBODIMENTS

The invention is based upon the following observation:

Ion implantation of a highly-doped layer in a semiconductor material promotes the creation of neighbouring insulating layers. This phenomenon is particularly marked in the case of gallium arsenide.

In the following, two embodiments of the invention will be described.

FIRST EXAMPLE

A PIN diode with a very thin (of the order of one tenth of a micron) intrinsic layer.

Figures 1A, 1B:
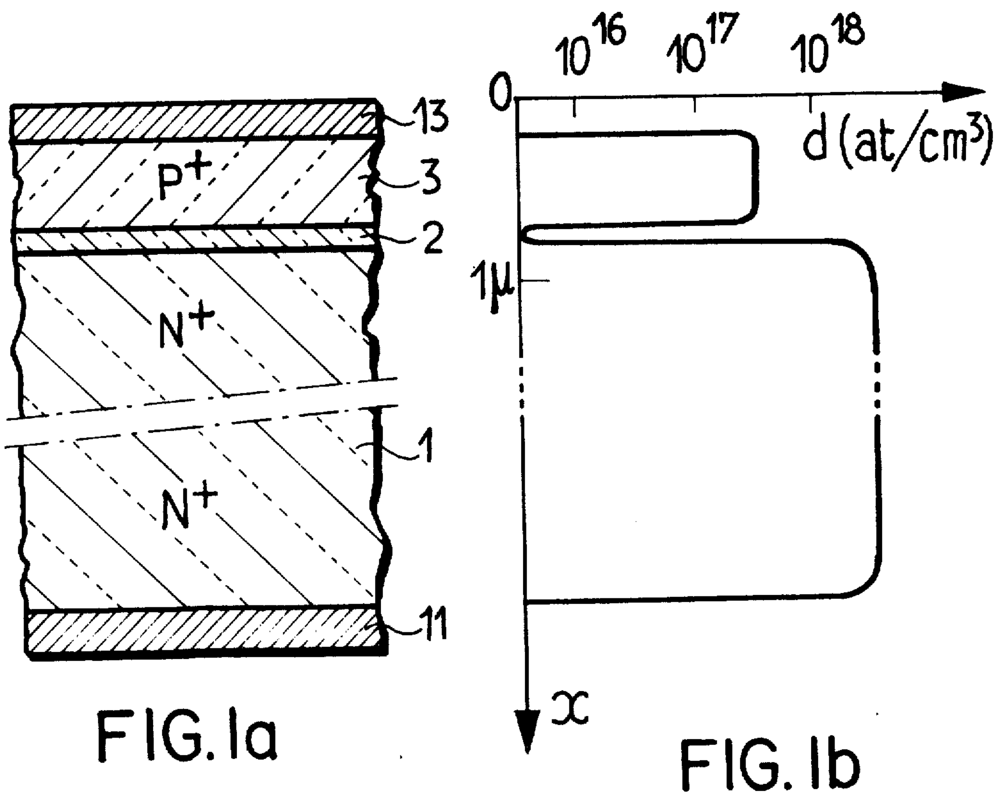

In FIG. 1, at "*a*", a partial section through a gallium arsenide sample with flat major surfaces, has been shown. In this semiconductor material, it is desired to produce the following structure:

a region 1 representing the substrate used as the starting point of manufacture, which is highly N-doped (doping impurity density of $3.10^{18}$ atoms/cm$^3$), the thickness of the region 1 being of the order of one hundred microns;

an insulating (I) or weakly N-doped (N−) region 2, with an impurity density of less than $10^{16}$ at/cm$^3$, the desired thickness being of the order of one tenth of a micron, this posing a problem which is currently difficult to overcome as far as manufacture is concerned;

A P+-doped region 3 ($10^{17}$ to $10^{18}$ at/cm$^3$), having a thickness of the order of one micron or ten microns).

Ohmic contacts 11 and 13 (metal alloys, for example or N++ and P++ layers) are respectively deposited upon the regions 1 (N+) and 3 (P+).

If the layer 2 is relatively thick (more than one micron), the following process is used:

a. bombardment of the N+ substrate with protons having an energy corresponding to the depth of the layer I which is to be formed, this producing neutralisation of the negative charges within the body of the gallium arsenide;

b. formation of the P+ layer by a conventional method (diffusion or epitaxy);

c. formation of ohmic contacts 11 and 13 in the manner indicated hereinbefore.

In the case of the invention, the P+ and I layers are formed in a single operation. In other words, the step (a) of the above process is discarded. The implantation of the P+ layer is carried out directly by bombarding the substrate with beryllium ions having an energy (momentum) of around 50 KeV, with a density of $10^{14}$ at/cm$^2$. Implantationis carried out on a substrate which is maintained at ambient temperature.

The insulating layer obtained at 2 has a thickness of the order of one tenth of a micron. No later heat treatment is required.

SECOND EXAMPLE

High-efficiency microwave avalanche diode.

We will consider the case of gallium arsenide diodes which make it possible to achieve efficiencies in the order of 20 to 30%.

Figures 2A, 2B:
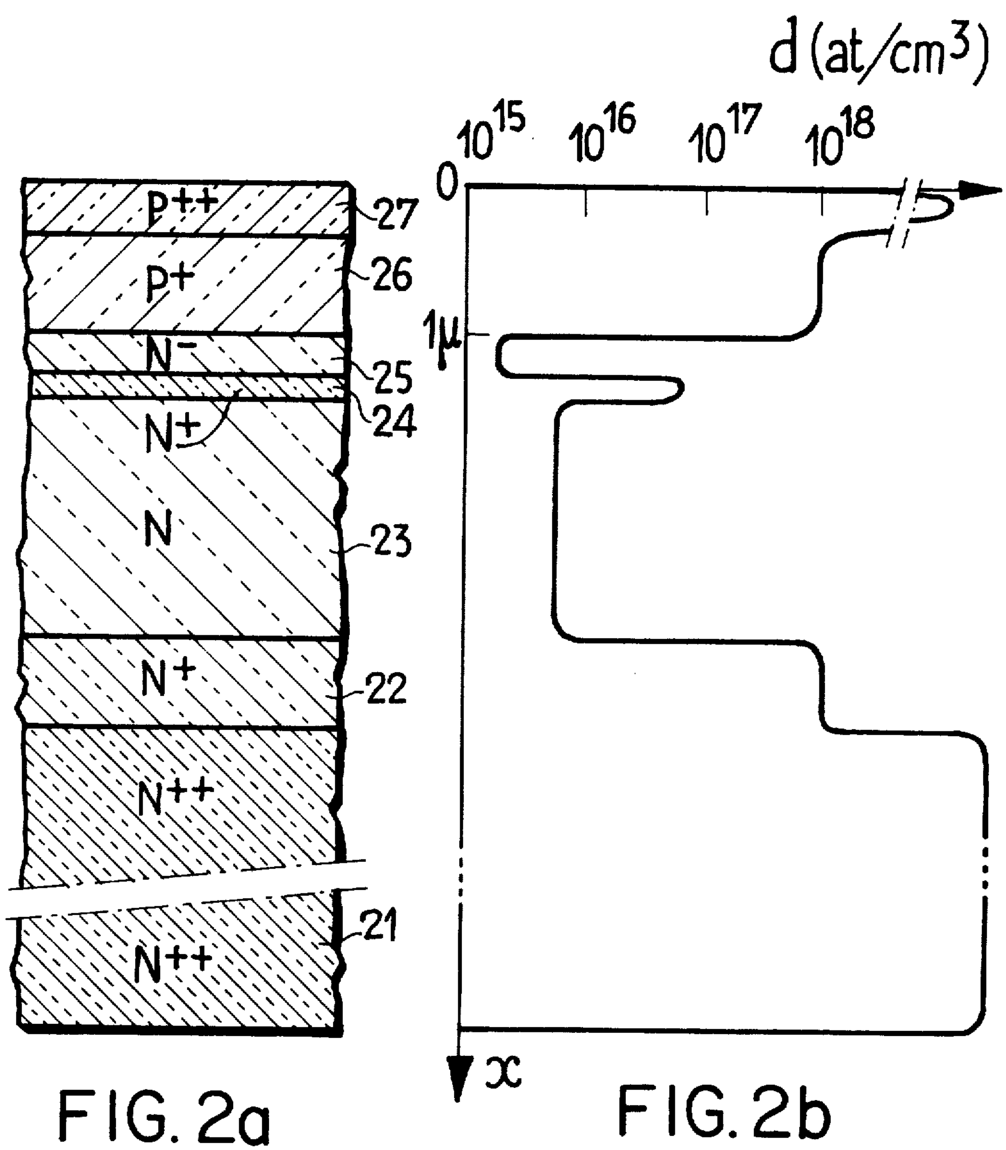

FIG. 2 illustrates the following structure:

at 21, an N++ -doped substrate (more than $10^{18}$ at/cm$^3$);

at 22, an N+-doped "buffer" layer (of the order of $10^{17}$ at/cm$^3$);

at 23, an N-doped layer (from 3 to $6 \times 10^{15}$ at/cm$^3$);

at 24, an N+ -doped layer (more than $10^{16}$ at/cm$^3$ and less than $10^{18}$ at/cm$^3$, which is extremely thin, in the order of one tenth of a micron;

at 25, an insulating or N−—doped layer, which is also extremely thin;

at 26, a P+ -doped layer having a thickness of the order of one micron;

at 27, a P++ -doped layer doing duty as ohmic contact.

In avalanche operation, the layers 23 and 24 constitute the avalanche zone proper, the layer 25 constituting a transit zone. The buffer zone 22 serves to mask the imperfections in the interface between the layer 23 and the substrate.

The production of this kind of structure using known methods, involves for example several successive epitaxy operations. The layers 24 and 25 thus obtained are too thick. Accordingly, a lengthy and delicate process of grinding each of these layers after their respective epitaxial deposition, becomes necessary.

In the case of the invention, epitaxial deposition of a thicker layer 23 is carried out, in which the layer 24 and the layer 26 are successively implanted by ion bombardment using appropriate ions, the insulating or N− -layer arising automatically between the layers 24 and 26.

Those skilled in the art will be aware that the use of heavier ions (for example cadmium or zinc instead of beryllium, for the P+ -doping function) makes it possible to increase the thickness of the insulating or N− -layer. The increase in the density per $cm^2$, of the ion bombardment, also has the same effect.

By contrast, the prior implantation of arsenic or gallium arsenide, makes it possible to reduce the thickness of the insulating or N− -zone.

In the case in which it is desired to subject the electronic component thus obtained to a heat treatment following implantation, the structure must be previously covered with a very thin (2000 A will suffice) silica deposit produced at low temperature, as for example by cathode sputtering. It is also possible to carry out pyrolysis of an organic compound of silicon, at up to 400° C. The heat treatment is preformed at a temperature of the order of 600° to 700° C for around half an hour.

Such a treatment improves the stability of the structure without deterioration, owing to the relatively low temperatures used.

What is claimed as new and desired to be secured by Letters Patent of the United States is:

1. A method of manufacturing a semiconductor structure designed for microwave operation, comprising at least two following steps:

a. excessively doping by N type impurities to a concentration in excess of $10^{16}$atom/$cm^3$ at least a layer of a gallium arsenide substrate having two parallel large faces;

b. bombarding said substrate with beryllium ions so as to implant an excessively P-doped layer to a concentration in excess of $10^{16}$atom/$cm^3$ parallel to said large faces, thus promoting at the border separating the N and P layers the spontaneous formation of a thin layer much less doped than said N and P layers.

2. A method as claimed in claim 1, wherein, at step (a), said N-doped layer is spread in the whole substrate and at step (b) said P-doped layer is implanted starting from one large face of said substrate, thus creating a PIN structure.

3. A method as claimed in claim 1, wherein at step (a) the starting structure comprises:

an N++ -doped layer (more than $10^{18}$ at/$cm^3$);

an N+ -doped layer (density of the order of $10^{17}$ at/$cm^3$)

an N layer (density of the order of $10^{15}$ at/$cm^3$) in which has been implanted by ion bombardment an N+ -doped layer (density between $10^{16}$ and $10^{18}$ at/$cm^3$) the thickness of which is lower than 1/10 microns.

* * * * *